United States Patent [19]

Epley et al.

[11] Patent Number: 5,490,171

[45] Date of Patent: Feb. 6, 1996

[54] SINGLE-PORT NETWORK NODE TRANSCEIVER WITH POWERED-DOWN PROTECTION

[75] Inventors: Phillip R. Epley; Charles R. Hoffman; Jaideep Prakash, all of Raleigh, N.C.

[73] Assignee: International Business Machines Corporation, Armonk, N.Y.

[21] Appl. No.: 208,603

[22] Filed: Mar. 9, 1994

[51] Int. Cl.$^6$ .............................. H04B 3/00; H04B 1/38
[52] U.S. Cl. .................. 375/257; 375/219; 375/258; 327/208
[58] Field of Search ..................... 375/219–220, 375/257–258, 288, 317, 377; 333/32; 455/73; 327/203, 207, 208

[56] References Cited

U.S. PATENT DOCUMENTS

| | | | |
|---|---|---|---|
| 4,161,008 | 7/1979 | Zimmermann et al. | 361/56 |
| 4,585,905 | 4/1986 | Brown | 379/412 |
| 4,630,284 | 12/1986 | Cooperman | 375/257 |
| 4,636,654 | 1/1987 | Lach | 307/497 |
| 4,709,296 | 11/1987 | Hung et al. | 361/102 |
| 4,751,607 | 6/1988 | Smith | 361/119 |
| 4,953,055 | 8/1990 | Douhet et al. | 361/62 |
| 5,003,579 | 3/1991 | Jones | 379/93 |
| 5,077,756 | 12/1991 | Christophersen | 375/258 |
| 5,095,291 | 3/1992 | Staschover et al. | 333/12 |
| 5,142,429 | 8/1992 | Jaki | 361/56 |

FOREIGN PATENT DOCUMENTS 0187339  7/1986  European Pat. Off. .............. 375/257

OTHER PUBLICATIONS

IBM Technical Disclosure Bulletin vol. 23 No. 8 Jan. 1981.

*Primary Examiner*—Young Tse
*Attorney, Agent, or Firm*—Steven B. Phillips

[57] ABSTRACT

A single-port network node transceiver that does not draw any substantial current from the network when it is powered-down, enabling it to meet the ISDN powered-down loading specification when built on a CMOS integrated circuit chip. The pull-up transistors of the transmitter output circuit each have means for shorting the well terminal to source terminal connection when the circuit is operating and opening the connection when the power to the transceiver is shut down. The opening of this connection prevents the well-substrate junction of the pull-up transistors from becoming forward biased and drawing current from the network when the power to the transceiver is off and there is voltage present on the network. The transceiver also includes a plurality of ESD overvoltage protection diodes in series between the power supply rail and each input/output terminal. Since multiple diodes are connected in series and their voltage drops are added together, the diodes also do not draw current from the network when the transceiver is powered down.

11 Claims, 8 Drawing Sheets

SINGLE-PORT NETWORK NODE TRANSCEIVER WITH POWERED-DOWN PROTECTION

BACKGROUND

1. Field of the Invention

This invention relates to transceiver circuits for computer networks. In particular, it relates to the type of transceiver that is used to interface a communications node of a computer network to the network for receiving and transmitting digital signals on the network. More specifically, the invention relates to the way such transceivers are protected from over-voltage and over-current conditions when the communications node is powered-down.

2. Prior Art

Figure 1:
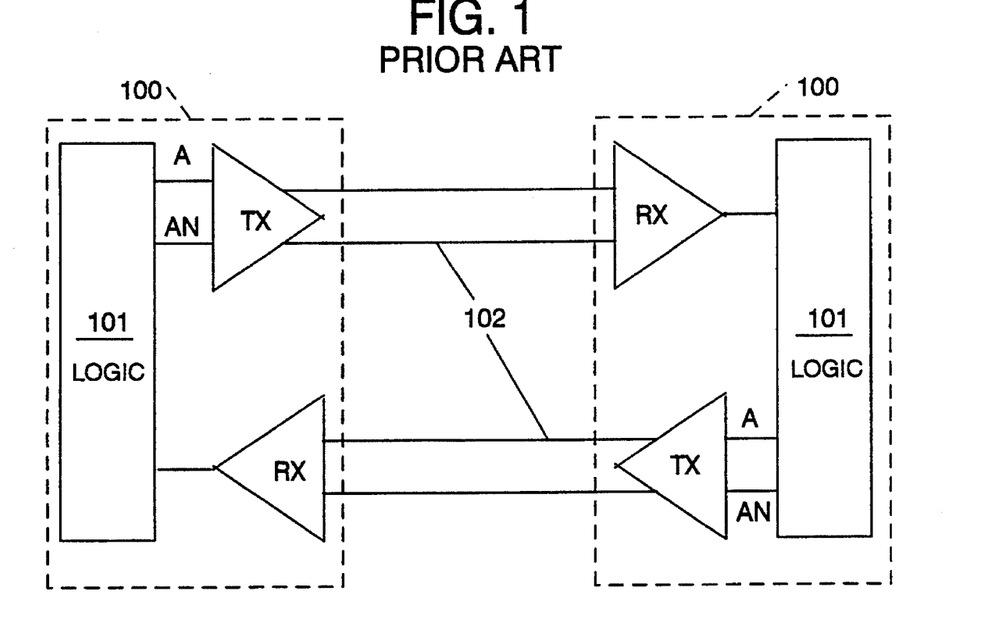
FIG. 1 shows a point-to-point network connection between two prior art, dual-port communications network transceivers.

Computer network communications node transceivers are well known in the art. Typically, these transceivers are built from circuits that are integrated onto a semiconductor chip. A block diagram of one such prior art transceiver chip is shown as part of FIG. 1. A transceiver 100 comprises a receiver RX, a transmitter TX, and logic circuitry 101 to control the operation of the transmitter and receiver and communicate with the processor in the node in which the transceiver is installed. The transmitter has a pair of output terminals and the receiver has a pair of input terminals. The transmitter receives from the logic circuitry a control signal A and its compliment AN. The transceivers of FIG. 1 are shown coupled to a point-to-point communications network 102 so they can communicate with each other. Typically the transceivers are coupled through a transformer and a terminating resistor; these elements are omitted for simplicity.

Figure 2:
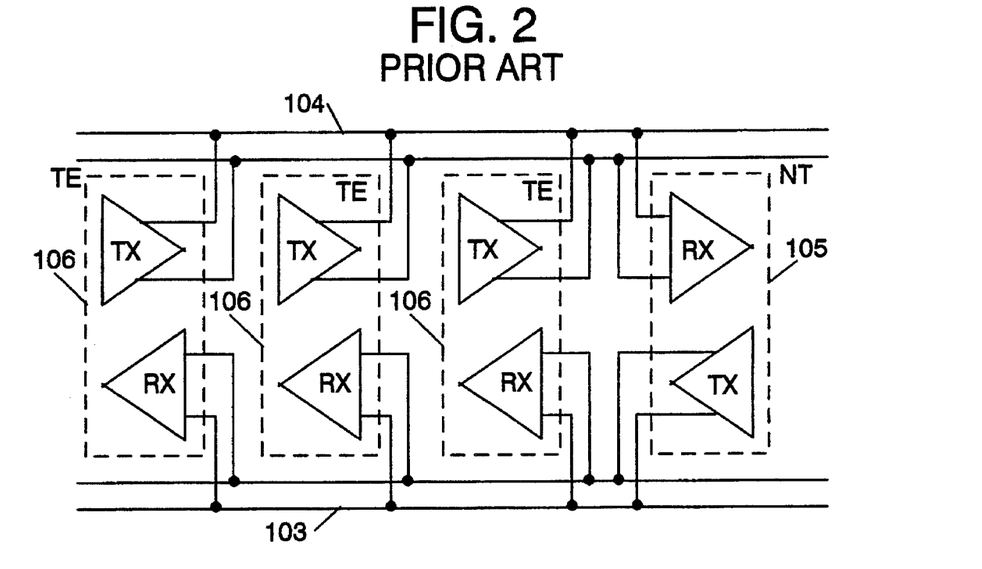
FIG. 2 shows a multi-drop network connection between multiple prior art, dual-port, communications network transceivers.

An example of one type of network in which communications node transceiver chips are employed is the Integrated Services Digital Network or ISDN. The internationally recognized specification for the standard 4-wire ISDN interface is CCITT Recommendation I.430. According to this specification, a multi-drop ISDN network can be configured with a number of full-function ISDN stations or nodes called "NT's" (network termination) and a large number of lesser function stations or nodes called "TE's" (terminal equipment). The NT's can transmit to many other TE's and receive from many other TE's, whereas the TE's can only transmit to an NT and receive from an NT. The transceivers of such a multi-drop ISDN and their interconnection are shown in FIG. 2. The NT transceiver 105 transmits to the TE transceivers 106 on the wire pair 103 and the NT transceiver 105 receives from the TE transceivers on wire pair 104. Once again, coupling transformers and terminating resistors which would normally be external to the transceiver chips but within the communications nodes are not shown for simplicity. The control logic within the transceiver chips is also not shown for simplicity.

An important part of the ISDN specification is related to powered-down loading. To prevent a TE which is powered down from loading down the NT transmit lines, a maximum allowable current that can be drawn from the network by a powered-down TE is specified. For a 1.2 Volt peak value 96 kHz signal the current must be no greater than 0.5 mA peak. Since prior art ISDN transceivers had separate terminal pairs for transmit and receive, a powered-off protection circuit to enable an ISDN transceiver to meet this specification had to take into account primarily only the receiver circuit characteristics.

Figure 5:
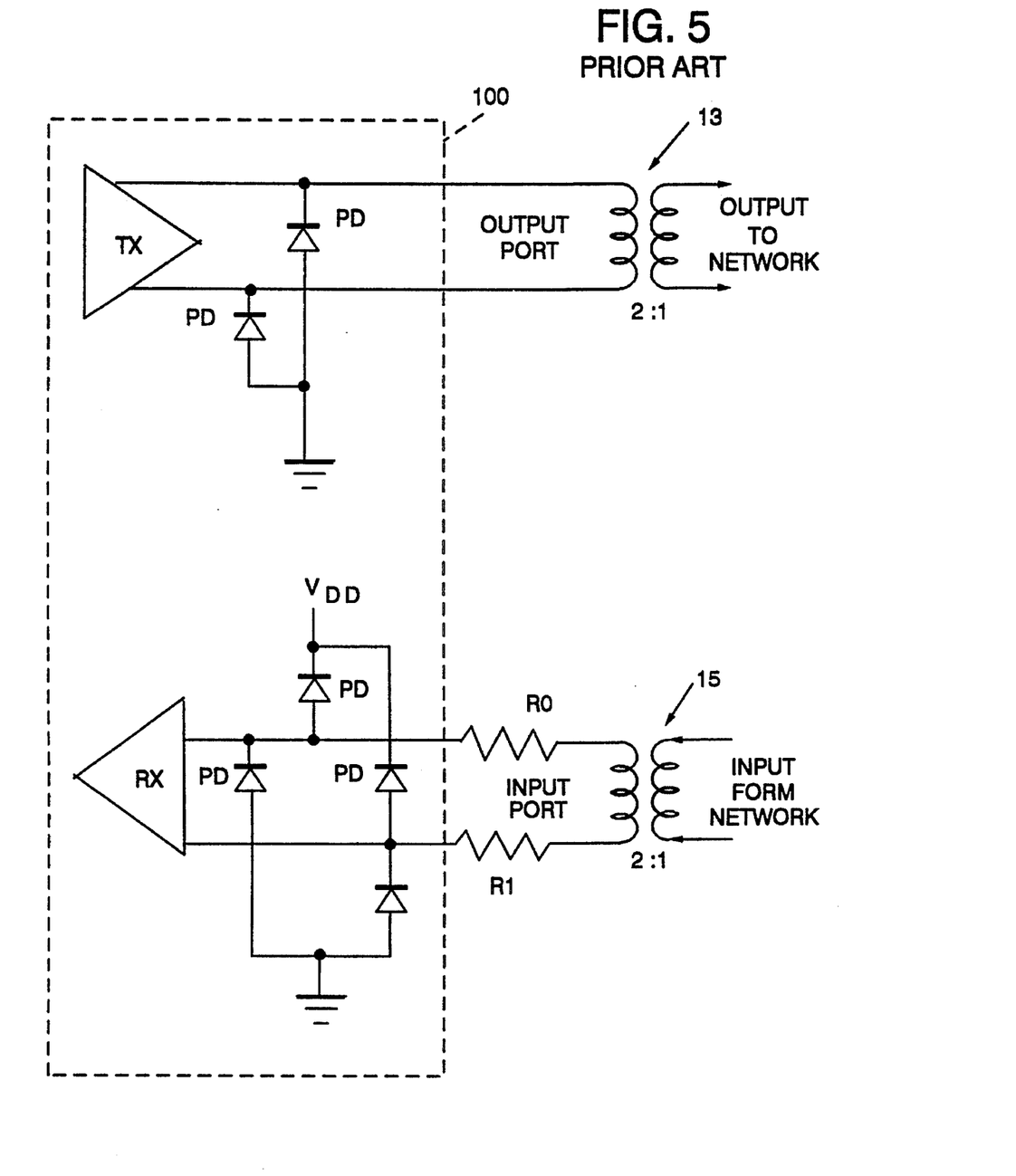
FIG. 5 shows ESD protection diodes and a powered-down protection scheme as typically designed in a prior art, dual-port, communications network transceiver.

FIG. 5 shows the detail of a typical prior art powered-down protection scheme in a transceiver 100 like that shown in FIGS. 1 and 2. Typically, the receiver is interfaced to the network through a 2:1 turns ratio coupling transformer 15. This means that 2.4 volts is applied to the receiver (1.2 volts times 2) during powered-down testing. For most ISDN transceivers, overload protection against electrostatic discharge (ESD) is desired. This overload protection is usually provided by ESD protection diodes PD integrated into the chip and connected between the receiver inputs, the power supply rail $V_{DD}$, and ground. If the receiver input terminals were to be connected directly to the coupling transformer which is in turn connected to the network, the ESD protection diodes would be forward biased when the power to the transceiver is off (i.e. $V_{DD}$=0) and a voltage with magnitude greater than a diode drop is present across the input terminals; thereby drawing too much current for the receiver to meet the ISDN powered-down specification. To provide powered-down protection for the receiver, current limiting resistors R0 and R1 are placed in the line between the receiver input terminals and the transformer. Since the diodes connected to the power supply do not conduct until the voltage across them is at least 0.7 V, depending on the technology used, the resistors limit the current enough to meet the specification when the power supply voltage $V_{DD}$ goes to 0 and a peak voltage of 2.4 V is present on the receiver input. The transmitter output terminals are connected to a separate 2:1 transformer 13 and may also be connected to ESD protection diodes. No current limiting is needed for the transmitter because it is separate from the receiver.

While the above scheme works well and provides ISDN communications to many users satisfactorily, it has a major disadvantage when it comes to configuring a network. Since each transceiver has separate ports for receive and transmit, a user must know which set of wires is which and keep them straight over the entire network. Also, if a user wishes to change a TE type node to an NT type node or vice versa, wiring changes must be made. It would be much more desirable to use so-called "single-port" transceivers for an ISDN network; that is transceivers with a single set of input/output terminals that both transmit and receive signals.

Figure 7:
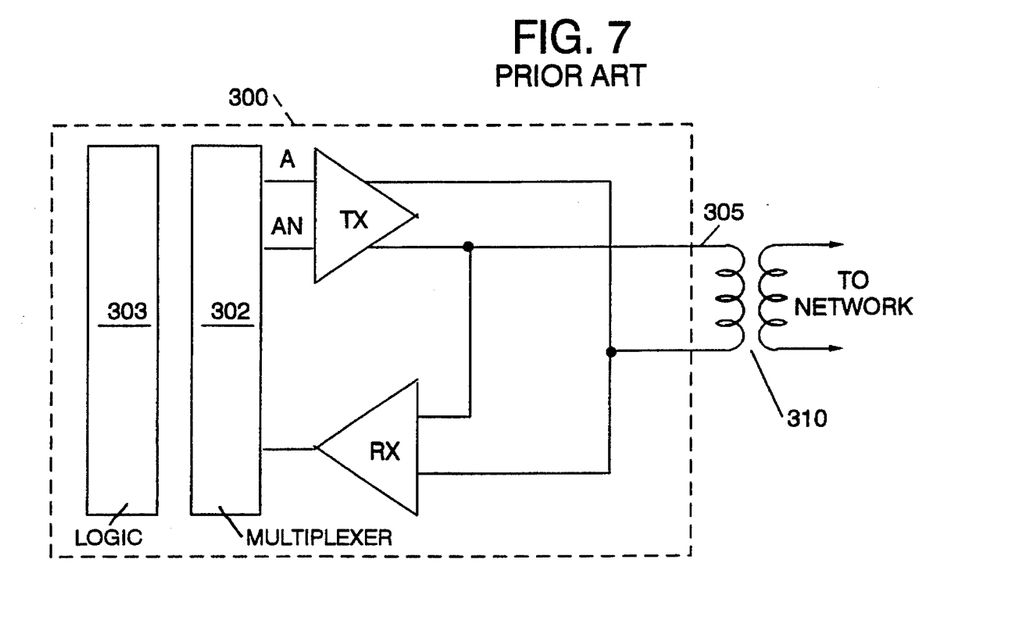
FIG. 7 shows a block diagram of a single-port network node transceiver of the type in which the present invention is employed.

Single-port transceivers are already known in the art. FIG. 7 shows a simplified block diagram of a typical single-port network communications transceiver 300. The transmitter TX and receiver RX are connected to the input/output terminals 305 of the transceiver 300 in parallel. A multiplexer 302 is controlled and fed signals by logic circuits 303. The multiplexer alternatively activates either the receiver or the transmitter to put the transceiver in either receive mode or transmit mode under software or microcode control. The transceiver is coupled to a single set of network wires through the transformer 310.

Figure 8:
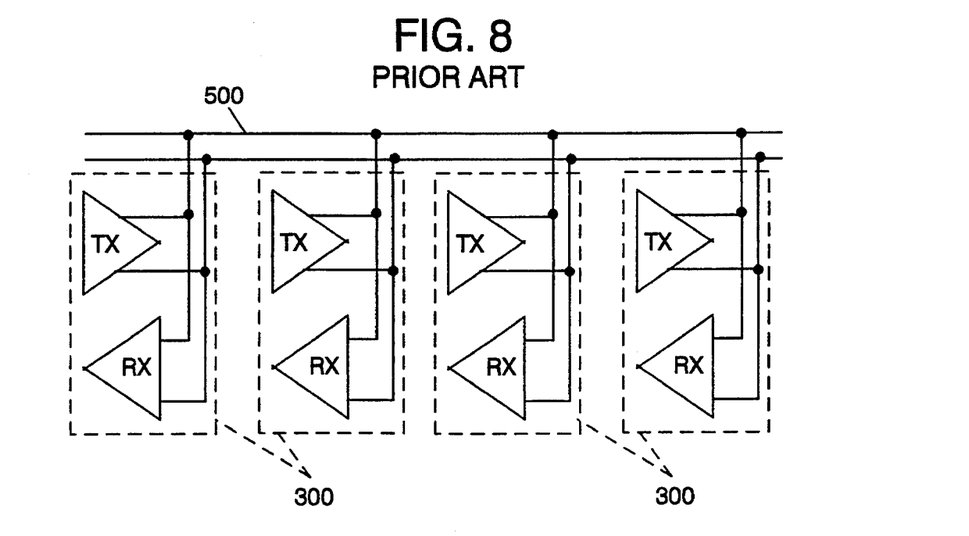
FIG. 8 shows how the single-port network node transceiver of FIG. 7 can be connected in a multi-drop ISDN network.

With a single-port transceiver, an ISDN network could be configured as in FIG. 8 with each transceiver 300 connected to the network 500 in an identical fashion. The selection of which nodes are to act as NT's and which as TE's could be changed quickly, without re-wiring. Such a scheme would greatly increase the flexibility of network connections and layout.

Unfortunately, single-port transceivers have seldom been employed with ISDN because of the powered-down protection requirements of the ISDN specification. With the transmitter and receiver in parallel, the resistors previously discussed will not work because the resistors would be in the output lines while the transceiver is transmitting and would attenuate the signal too much to drive the network adequately. With the resistors removed, not only do ESD protection diodes draw too much current in the powered-down state to meet the ISDN specification, but the transmitter would also draw current because of the inherent design of the typical transmitter output circuit, discussed below.

Figure 3:
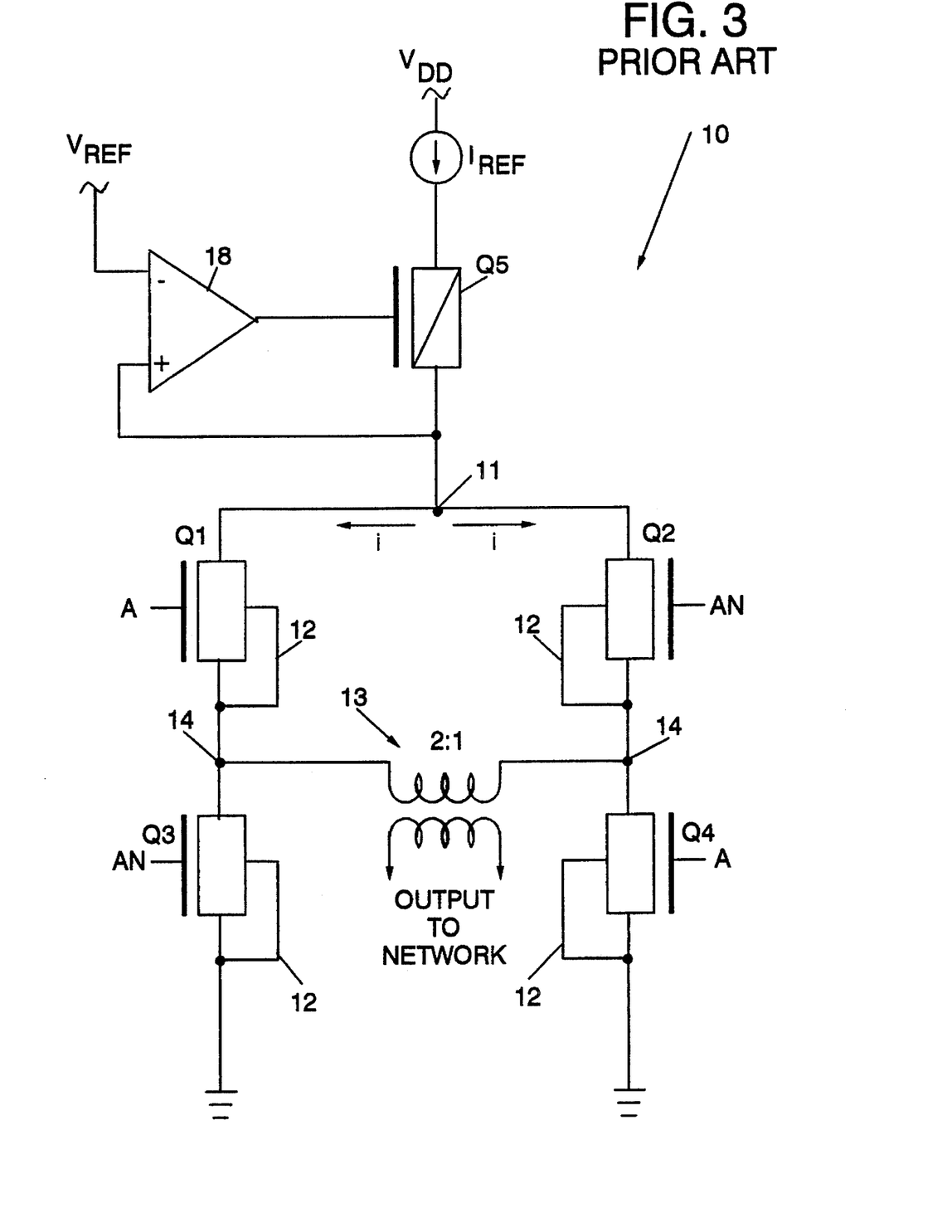
FIG. 3 shows a prior art transmitter output circuit typically used in the transmitter of the dual-port transceiver shown in FIGS. 1 and 2.
Figure 4:
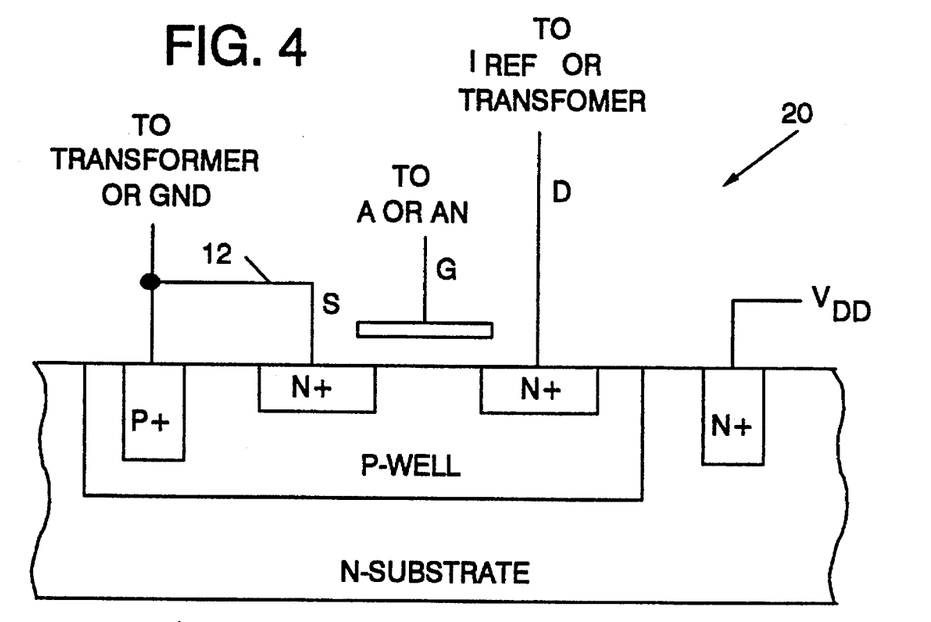
FIG. 4 shows the fabrication detail of the n-channel field effect transistors that are be used in the circuit of FIG. 3 and in the current invention.

The typical transmitter output circuit as shown in FIG. 3 has an input for a reference current, $I_{REF}$ at 11. The reference current can be supplied in any number of well-known ways. In this example the current source is connected in series with a voltage clamp consisting of the operational amplifier 18 and the p-channel transistor Q5. The circuit itself consists of two transistor pairs, the first consisting of Q1 and Q3 in a pull-up, pull-down arrangement that is well known, and the second consisting of Q2 and Q4 in the same arrangement. The circuit is driven by the control logic 101 of FIG. 1 with a control signal A and its compliment AN. The output terminals 14 drive the transformer 13 of FIG. 3. In the usual arrangement, the pull-up and pull-down transistors are the normally-off, n-channel p-well type fabricated on an n type substrate. As is well known in the art, the well terminal of each transistor must be tied to a low potential in order to ensure that the well remains at a lower voltage than the drain so that current can flow when the transistor turns on. In practice, the well terminal of the transistor is usually tied to the source as with the connections 12 of FIG. 3. To ensure the well-to-substrate junction does not become forward biased, the substrate is normally tied to $V_{DD}$. A cross section of a transistor 20 showing fabrication detail and these connections is shown in FIG. 4. Because of this arrangement, when power is cut off from the chip and $V_{DD}$ goes to 0 volts, voltage on the input/output terminals causes the well-to-substrate junction of the pull-up transistors to be forward biased, and so the transmitter draws current from the network in excess of the specification.

In order to solve similar problems, over-voltage and over-current protection schemes used in other types of networks where single-port transceivers are employed have often involved mechanical relays, as is the case for the circuit disclosed in U.S. Pat. No. 4,709,296 to Hung et al. Such relays take up space outside the transceiver chip and have low reliability. Solid state protection circuits have been developed to replace the relay, but until now such circuits have been fairly complex and have had too many components to allow easy integration onto the transceiver chip. Such a solid state protection circuit is disclosed in U.S. Pat. No. 5,142,429 to Jaki.

What is needed is a powered-down protection scheme that would require only a very simple circuit with few components in addition to those already present in a typical transceiver design. Such a scheme would allow the protection circuitry to be easily integrated onto the transceiver chip so that single-port transceivers can be used with ISDN networks.

SUMMARY

The present invention provides powered-down protection for a single-port communications node transceiver so that it meets CCITT Recommendation I.430 and can be used in ISDN networks. The invention provides protection circuitry that is simple and can be integrated easily into the design of a transceiver chip, thus saving printed circuit board space. The preferred embodiment is most easily built using complimentary metal oxide semiconductor (CMOS) technology.

The invention includes an improvement to the transmitter output circuit described above, wherein the circuit now includes means for selectively shorting the well terminals and the source terminals of the pull-up transistors of the transmitter output circuit so that the desired connection between the well and the source is maintained when the transmitter is operating, but is severed when the power to the transmitter output circuit is disconnected. Thus, there is no forward biased P/N junction between the well and the substrate of the pull-up transistors of the transmitter output circuit to draw current from the network. In the preferred embodiment of the invention, the means for selectively shorting the well and source terminals of each pull-up transistor is a normally-on, n-channel field effect transistor. This transistor is gated by the supply voltage so that it is on when the circuit is operating, but shuts off to isolate the well from the source and therefore also from the output terminals of the circuit when the transceiver supply voltage goes to 0 volts.

Overvoltage protection from ESD is provided for both the receiver and the transmitter with protection diodes. Individual protection diodes are used to shunt to ground as in the prior art. However, simple, single diodes between the input/output terminals and the power supply terminal cannot be used to shunt to the power supply voltage rail in a single-port transceiver, because the diodes would again provide a forward biased P/N junction to draw current from the network and cause the transceiver to fail to meet the ISDN powered-down current specification. To solve this problem, a plurality of diodes is used in series between each input/output terminal and $V_{DD}$, in order to increase the voltage required to cause the diodes to conduct. The number of diodes needed depends on the voltage drop of the particular type of diodes employed, and the turns ratio of the input/output transformer, but one skilled in the art can easily design an arrangement in which the voltage required to cause the diodes to conduct is greater than the maximum test voltage for powered-down leakage current seen at the transceiver input/output terminals.

While the preferred embodiment of this invention finds its use primarily in ISDN type transceivers, the same circuit arrangement could be used in any communications network transceiver where protection from powered-down loading is needed. Additionally, the improved transmitter output circuit could be used without the overvoltage protection diodes if ESD protection is not needed, but the protection against powered-down loading is desired.

DETAILED DESCRIPTION OF THE PREFERRED EMBODIMENT

Figure 9:
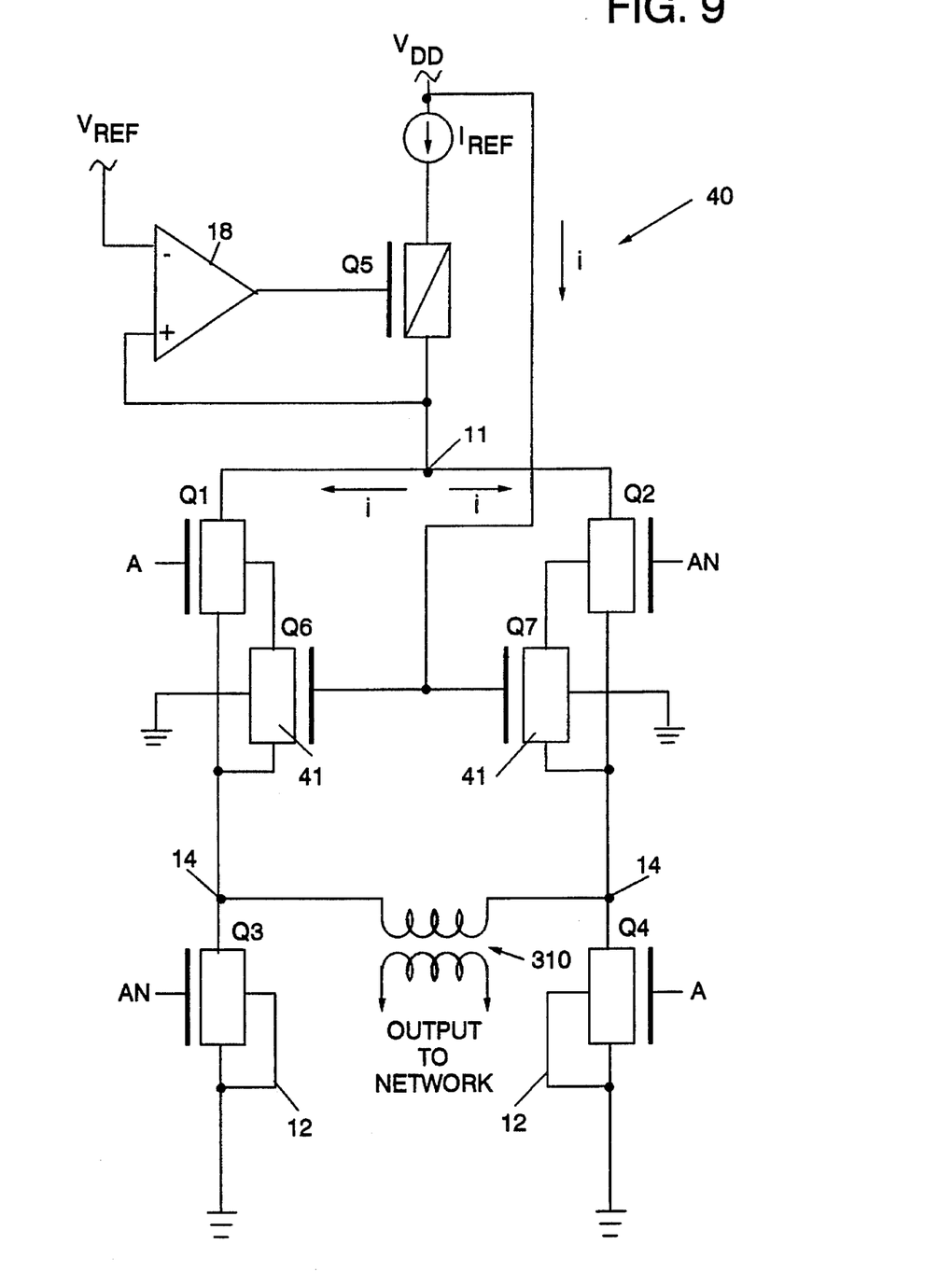
FIG. 9 shows the transmitter output circuit of the single-port network node transceiver of FIG. 7 with powered-down protection according to this invention.

The single-port transceiver that is the subject of this invention comprises, in part, the improved transmitter output circuit 40 of FIG. 9. When operating, most of the circuit functions in the same manner as the circuit of FIG. 3, as is indicated by the common reference numbers and component labels. The chip containing the transceiver has a first supply voltage, $V_{DD}$ which is positive, and a second supply voltage. In the preferred embodiment, using CMOS technology, the second supply voltage is the circuit ground, GND. A similar circuit, however, might be used in other embodiments with other integrated circuit technologies where the second supply voltage is simply a voltage of lower potential than the first supply voltage. The circuit of FIG. 9 makes use of both the first and second supply voltages. It is also supplied with a reference current, $I_{REF}$, through the reference current input 11. Any known circuit for supplying a reference current can be used; the precise means for supplying the reference current is unimportant to the invention. In the preferred embodiment, the current source is connected in series with a voltage clamp consisting of the op amp 18 in conjunction with the p-channel transistor Q5. These components are not considered part of the output circuit itself, but are nevertheless shown so that the operation of the circuit can be more easily understood.

The circuit 40 is driven by a first input A and a second input AN, which is the logical compliment of the first input A. A pair of output terminals 14 drive a network coupling transformer 310 which is in turn coupled to the network. In the preferred embodiment, this transformer is separate from the integrated circuit chip containing the single-port communications node transceiver, but the transformer is shown here so that the operation of the circuit can be more easily understood.

The transmitter circuit comprises a first transistor pair and a second transistor pair, each having a pull-up transistor and a pull-down transistor, arranged as in the prior art circuit 10 of FIG. 3. Each transistor pair is disposed between the reference current input and the second supply voltage which is in the preferred embodiment, ground. The first pair is made up of Q1 as the pull-up transistor and Q3 as the pull-down transistor. The second transistor pair is made up of Q2 as the pull-up transistor and Q4 as the pull-down transistor. The first pull-up transistor Q1 is gated by the first input A and the first pull-down transistor Q3 is gated by the second input AN. The second pull-up transistor Q2 is gated by the second input AN and the second pull-down transistor Q4 is gated by the first input A. A pair of output terminals 14 are disposed between the pull-up and pull-down transistors of the pairs. The transistor pairs are thus driven in a complimentary fashion, so that when one output terminal 14 is high the other is low and vice versa. The transformer 310 is therefore driven at the input frequency and in turn drives the network.

The transistors used for the transmitter output circuit in the preferred embodiment are normally off, n-channel field effect transistors having p type wells and fabricated on an n type substrate. A cross section of such a transistor 20 integrated onto a chip is shown in FIG. 4. The transistor is fabricated with the p-type well connected to a well terminal. As is well known to those skilled in the art, during operation, the well must be tied to a potential which is lower than the drain D of such a transistor to prevent forward biasing of the well drain junction and reverse current flow. This condition is achieved by tying the well terminal to the source terminal of the transistor. In the prior art circuit, and in the case of the pull-down transistors of the improved transmitter output circuit of this invention, the well terminal is tied to the source terminal with the connections 12, shown in FIG. 3, FIG. 4, and FIG. 9. Additionally, the substrate is tied to $V_{DD}$ to keep it at a higher potential than the well and prevent current flow during operation through a forward biased substrate to well junction.

While the above arrangement allows for proper operation of the circuit, it also creates the powered-down loading problem as discussed in the BACKGROUND section if the well to source connections of the pull-up transistors are maintained when the power to the transmitter output circuit is shut down. Referring again to FIG. 9, when the power to the circuit is shut down, $V_{DD}$ goes to 0 volts. The inputs A and AN will also go to 0 volts because the logic circuitry generating these signals will be powered down. Voltage from the network, however, will induce a voltage on the output terminals 14 through the transformer 310. If the well terminals of transistors Q1 and Q2 were to remain shorted to the source terminals, the well-substrate junction shown in FIG. 4 would become forward biased for each pull-up transistor and conduct, causing the transmitter to fail the ISDN powered-down specification. Therefore, according to this invention, means for maintaining the well-source connection when the power to the circuit is on and yet disconnecting the well terminal from the source terminal when the power is off are disposed between the well and source terminals of the pull-up transistors Q1 and Q2. In the preferred embodiment, the means are additional transistors 41 of FIG. 9 which are also normally off, n-channel, field effect transistors. For these transistors, the gates are connected directly to $V_{DD}$ and the wells are grounded. The substrates are again connected to $V_{DD}$. When $V_{DD}$ is on, the transistors 41, Q6 and Q7, are on. When $V_{DD}$, goes to 0 volts, these transistors shut off. Thus, by adding the transistors 41, the shorted well to source powered-down leakage current problem is eliminated. During normal operation, Q6 and Q7 are on and the desirable property of having the well and source shorted together is achieved. When powered down, Q6 and Q7 turn off and the wells are isolated from the sources and therefore also from the output terminals 14 thus preventing the well to substrate diode path and therefore also preventing any leakage current from being drawn from the network by the transmitter.

When the above circuit is employed in a transceiver, care must be taken to avoid introducing new paths through which leakage current can be drawn from the network. As discussed in the BACKGROUND section, the transmitter using the above circuit is most advantageously employed in a single-port network node transceiver and is connected in parallel with a receiver. The output terminals 14 of the transmitter output circuit 40 of FIG. 9 are then also input terminals for the receiver, and are thus called input/output terminals, but the operation of the transmitter output circuit is the same. For ISDN use, an overvoltage protection circuit in the form of electrostatic discharge (ESD) protection diodes is normally desired. The overload protection circuit in the preferred embodiment comprises ESD protection diodes between the input/output terminals of the transceiver and the supply voltage rails. Since the second supply voltage is ground in the preferred embodiment, individual diodes with the anodes connected to ground and the cathodes connected to the input/output terminals are used. For the first supply voltage, which is $V_{DD}$ in the preferred embodiment, individual diodes with their anodes connected to the input/output terminals and their cathodes connected to the supply rail cannot be used, as doing so would put a forward biased diode between each network input/output terminal and $V_{DD}$ when the power to the transceiver chip is shut down and voltage is present on the network, thus causing unacceptable leakage current to be drawn from the network. Therefore, a plurality of diodes in series is used. The number of diodes must be sufficient so that the sum of their forward biased junction voltage drops is greater than the network test voltage used to test for powered-down loading time the turns ratio of the input/output transformer.

Figure 10:
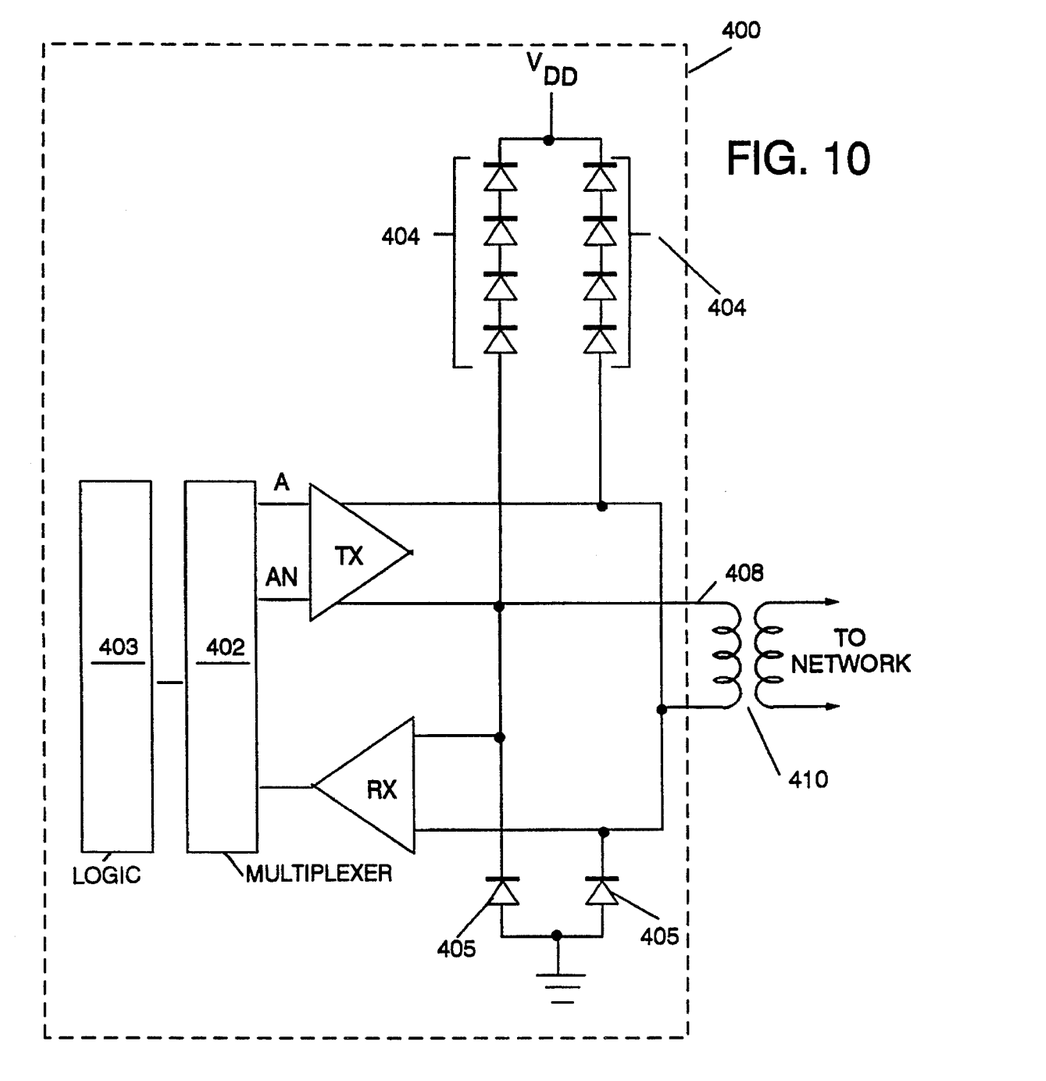
FIG. 10 shows the single-port network node transceiver according to this invention in which the circuit of FIG. 9 is employed, including the improved ESD protection and the coupling transformer.

FIG. 10 shows a block diagram of a single-port, communications node transceiver chip employing this invention, including the detail of the ESD overvoltage protection diodes. In the preferred embodiment, complimentary metal oxide semiconductor (CMOS) technology is employed to make the chip. For simplicity, a chip having only one transceiver is shown; however, it will be understood by those skilled in the art that multiple transceivers could be integrated on a single chip. The transceiver chip 400 comprises first a pair of input/output terminals 408. The transceiver also comprises a receiver RX, and a transmitter TX which includes the transmitter output circuit 40 of FIG. 9. The transmitter and receiver are disposed between the input/output terminals 408 and a multiplexer 402, which switches between transmit and receive modes by selectively activating the transmitter or the receiver. In transmit mode it supplies the transmitter with the two logic signals required, A, and its compliment AN. The operation of the multiplexer 402 is controlled by logic means 403. The logic means can be made to operate the multiplexer through program control, thus allowing the transceiver to be easily switched from transmit to receive operation and back again. The design details of both the logic means and the multiplexer are well known in the art and unimportant to the invention.

Figure 6:
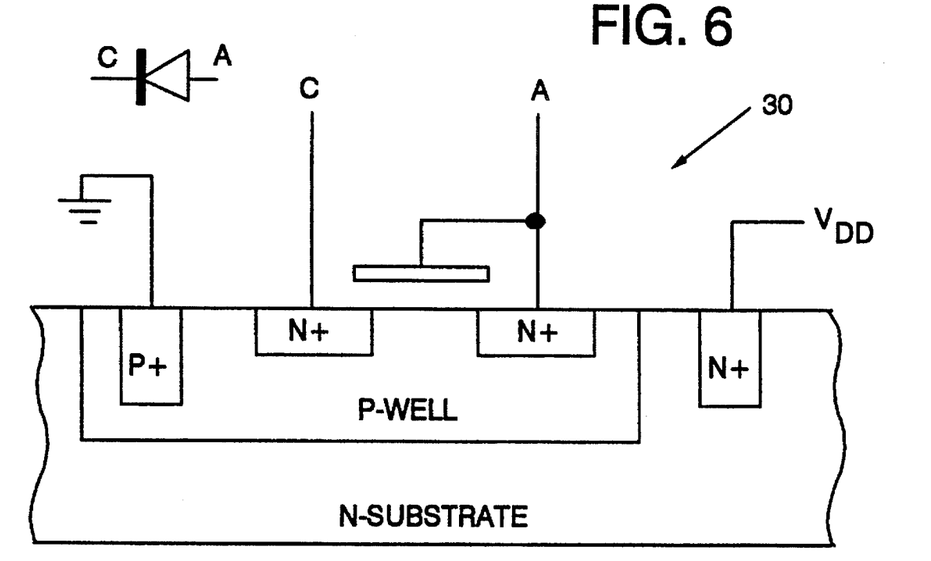
FIG. 6 shows fabrication detail of the ESD protection diodes shown in FIG. 5 and used in the current invention.

The transceiver chip 400 of FIG. 10 also includes the ESD protection diodes as previously discussed. The individual diodes to ground are shown at 405. In the preferred embodiment, for use in ISDN, four diodes in series 404 are connected between the input/output terminals and the power supply rail $V_{DD}$. For this embodiment to be used with ISDN, a 2.5:1 transformer 410 is required to connect the transceiver to the network in order to meet the ISDN drive requirements with the single-port integrated device taking process parameters into account. This transformer turns ratio results in a powered-down leakage current test voltage of 3 volts (1.2 V times 2.5 turns) being presented to the input/output terminals of the transceiver. Each diode is fabricated onto the chip together with the transmitter, TX, the receiver, RX, and the other circuits by making a grounded well, n-channel field effect transistor with the drain and gate shorted together as shown in the cross section 30 of FIG. 6. When the diodes are fabricated in this way, each has enough voltage drop when forward biased so that four together provide a voltage drop high enough to prevent any significant current from being drawn when 3 volts is applied to the input/output terminals.

It should be understood that although a 2.5:1 transformer and four diodes in series as described above are needed to make the invention work with a CMOS transceiver for ISDN, the same single-port transceiver design might require slightly different characteristics when used in another type of network or when employing a different circuit technology. The basic operation and design of the invention, however, would be the same.

Figure 11:
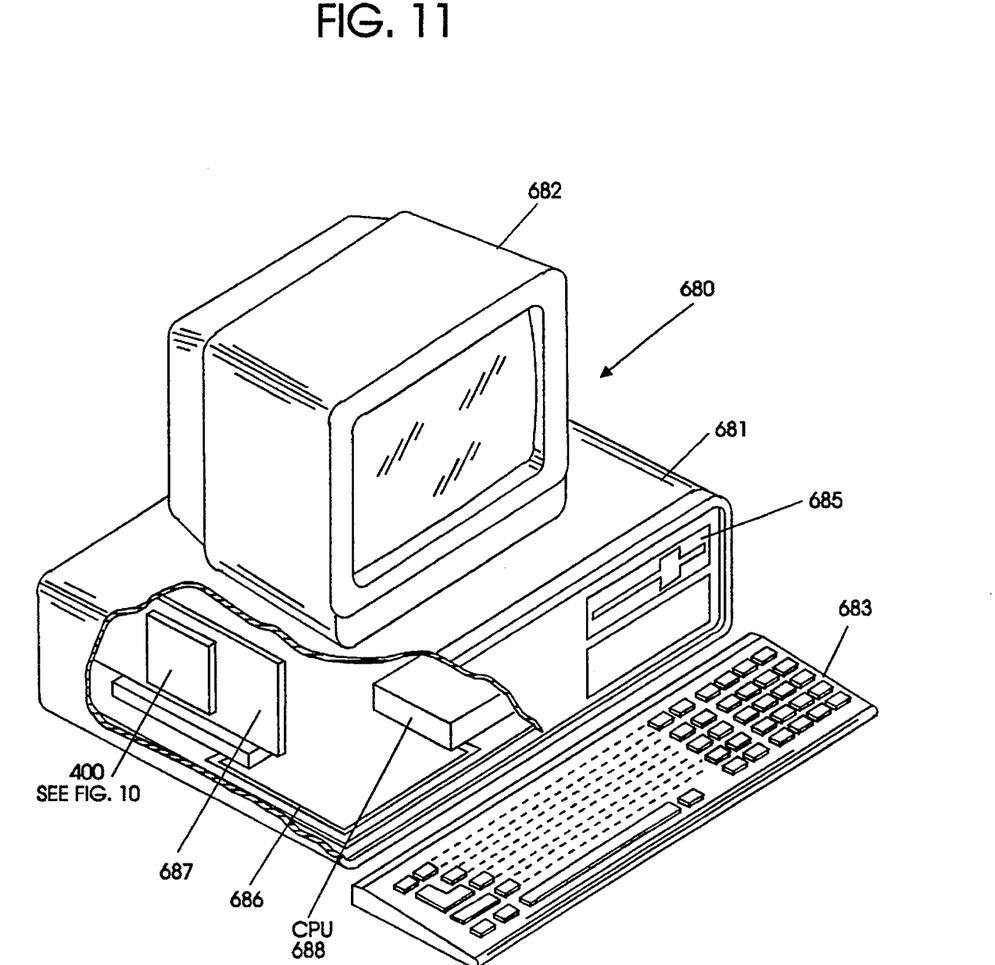
FIG. 11 shows a specific implementation of the invention within a microprocessor-based computer system.

FIG. 11 shows a specific implementation of the present invention, on a CMOS chip within a microprocessor based computer system 680. System 680 includes display 682, disk storage means 685, and keyboard 683. Chassis 681 encloses various computer hardware (not shown) typical of microprocessor-based computing systems. Within chassis 681, the central processor unit 688 is coupled via bus 686 to one or more peripheral adapters which comprise one or more adapter cards 687. An adapter card 687 includes chip 400 which comprises the circuitry of the present invention, and allows the computer system 680 to communicate with a network connected to the adapter card 687.

We claim:

1. A transmitter output circuit for a single-port communications node transceiver, the circuit comprising:

first and second supply voltage terminals;

first and second input terminals;

a reference current input terminal;

a first transistor pair including a first pull-up transistor having a gate terminal connected to the first input terminal and having a well terminal, a source terminal and a drain terminal, the drain terminal of the first pull-up transistor connected to the reference current input terminal, and further including a first pull-down transistor having a source terminal, a drain terminal and a gate terminal, the gate terminal of the first pull-down transistor connected to the second input terminal, the first transistor pair connected between the reference current input terminal and the second supply voltage terminal so that the drain terminal of the first pull-up transistor is connected to the reference current input terminal and the source terminal of the first pull-down transistor is connected to the second supply voltage terminal;

a second transistor pair including a second pull-up transistor having a gate terminal connected to the second input terminal and having a well terminal, a source terminal and a drain terminal, the drain terminal of the second pull-up transistor connected to the reference current input terminal, and further including a second pull-down transistor having a source terminal, a drain terminal and a gate terminal, the gate terminal of the second pull-down transistor connected to the first input terminal, the second transistor pair connected between the reference current input terminal and the second supply voltage terminal so that the drain terminal of the second pull-up transistor is connected to the reference current input terminal and the source terminal of the second pull-down transistor is connected to the second supply voltage terminal;

a pair of output terminals one of the pair of output terminals connected to the source terminal of the first pull-up transistor and the drain terminal of the first pull-down transistor, and another of the pair of output terminals connected to the source terminal of the second pull-up transistor and the drain terminal of the second pull-down transistor; and means connected between the well terminal and the source terminal for each pull-up transistor, and also connected to the first supply voltage terminal, for shorting the well and source terminals together when voltage is applied to the first supply voltage terminal and disconnecting the well and source terminals when no voltage is applied.

2. The transmitter output circuit of claim 1 wherein the means for shorting the well and source terminals for each pull-up transistor together is a transistor having a gate connected to the first supply voltage terminal and a well terminal connected to the second supply voltage terminal.

3. The transmitter output circuit of claim 2 wherein all the transistors are field effect transistors ("FETs").

4. The transmitter output circuit of claim 2 wherein all the transistors are normally-off n-channel field effect transistors.

5. The transmitter output circuit according to any of claims 1, 2, 3 or 4 further comprising:
a plurality of diodes in series connected between each of the pair of output terminals and the first supply voltage terminal; and
a diode connected between each of the pair of output terminals and the second supply voltage terminal.

6. A communications node transceiver chip including one or more single-port communications node transceivers, each communications node transceiver comprising:
first and second supply voltage terminals;
a pair of input/output terminals;
a multiplexer for selecting between transmit mode and receive mode;
logic means coupled to the multiplexer for controlling the multiplexer;
a receiver connected between the multiplexer and the input/output terminals; and
a transmitter connected between the multiplexer and the input/output terminals, the transmitter including a transmitter output circuit comprising:
first and second input terminals, each connected to the multiplexer;
a reference current input terminal;
a first transistor pair including a first pull-up transistor having a gate terminal connected to the first input terminal and having a well terminal, a source terminal and a drain terminal, the drain terminal of the first pull-up transistor connected to the reference current input terminal, and further including a first pull-down transistor having a source terminal, a drain terminal and a gate terminal, the gate terminal of the first pull-down transistor connected to the second input terminal, the first transistor pair connected between the reference current input terminal and the second supply voltage terminal so that the drain terminal of the first pull-up transistor is connected to the reference current input terminal and the source terminal of the first pull-down transistor is connected to the second supply voltage terminal, and the source terminal of the first pull-up transistor and the drain terminal of the first pull-down transistor are connected to one of the pair input/output terminals;
a second transistor pair including a second pull-up transistor having a gate terminal connected to the second input terminal and having a well terminal, a source terminal and a drain terminal, the drain terminal of the second pull-up transistor connected to the reference current input terminal, and further including a second pull-down transistor having a source terminal, a drain terminal and a gate terminal, the gate terminal of the second pull-down transistor connected to the first input terminal, the second transistor pair connected between the reference current input terminal and the second supply voltage terminal so that the drain terminal of the second pull-up transistor is connected to the reference current input terminal and the source terminal of the second pull-down transistor is connected to the second supply voltage terminal, and the source terminal of the second pull-put transistor and the drain terminal of the second pull-down transistor are connected to another of the pair input/output terminals; and means connected between the well terminal and the source terminal for each pull-up transistor, and also connected to the first supply voltage terminal for shorting the well and source terminals together when voltage is applied to the first supply voltage terminal and disconnecting the well and source terminals when the voltage is not applied.

7. The communications node transceiver chip of claim 6 wherein the means for shorting the well and source terminals for each pull-up transistor together is a transistor having a gate connected to the first supply voltage terminal and a well terminal connected to the second supply voltage terminal.

8. The communications node transceiver chip of claim 7 wherein all the transistors of the transmitter output circuit are field effect transistors ("FETs").

9. The communications node transceiver chip of claim 7 wherein all the transistors of the transmitter output circuit are normally off n-channel field effect transistors.

10. The communications node transceiver chip according to any of claims 6, 7, 8 or 9 wherein each single-port node transceiver includes an overvoltage protection circuit comprising:
a plurality of diodes in series connected between each of the pair of input/output terminals and the first supply voltage terminal; and
a diode connected between each of the pair of input/output terminals and the second supply voltage terminal.

11. An adapter card for use within a computer system, the adapter card including:
one or more communications node transceiver chips mounted on the adapter card, each transceiver chip having one or more pairs of input/output terminals and first and second supply voltage terminals, one or more of the communication node transceiver chips including one or more transmitter output circuits, each transmitter output circuit comprising:
first and second input terminals;
a reference current input terminal;
a first transistor pair including a first pull-up transistor having a gate terminal connected to the first input terminal and having a well terminal, a source terminal and a drain terminal, the drain terminal of the first pull-up transistor connected to the reference current input terminal, and further including a first pull-down transistor having a source terminal, a drain terminal and a gate terminal, the gate terminal of the first pull-down transistor connected to the second input terminal, the first transistor pair connected between the reference current input terminal and the second supply voltage terminal so that the drain terminal of the first pull-up transistor is connected to the reference current input terminal and the source terminal of the first pull-down transistor is connected to the second supply voltage terminal, and the source terminal of the first pull-up transistor and the drain terminal of the first pull-down transistor are connected to one of a given pair of input/output terminals;

a second transistor pair including a second pull-up transistor having a gate terminal connected to the second input terminal and having a well terminal, a source terminal and a drain terminal, the drain terminal of the second pull-up transistor connected to the reference current input terminal, and further including a second pull-down transistor having a source terminal, a drain terminal and a gate terminal, the gate terminal of the second pull-down transistor connected to the first input terminal, the second transistor pair connected between the reference current input terminal and the second supply voltage terminal so that the drain terminal of the second pull-up transistor is connected to the reference current input terminal and the source terminal of the second pull-down transistor is connected to the second supply voltage terminal, and the source terminal of the second pull-up transistor and the drain terminal of the second pull-down transistor are connected to another of the given pair of input/output terminals; and means connected between the well terminal and the source terminal for each pull-up transistor, and also connected to the first supply voltage terminal for shorting the well and source terminals together when voltage is applied to the first supply voltage terminal and disconnecting the well and source terminals when the voltage is not applied.

\* \* \* \* \*